(12) United States Patent
Nishioka et al.

(10) Patent No.: US 7,953,132 B2
(45) Date of Patent: May 31, 2011

(54) LASER DRIVER CIRCUIT AND LASER DISPLAY

(75) Inventors: Ken Nishioka, Daito (JP); Kenji Nagashima, Daito (JP); Atsuya Hirano, Daito (JP); Atsuhiko Chikaoka, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 12/555,256

(22) Filed: Sep. 8, 2009

(65) Prior Publication Data
US 2010/0061413 A1    Mar. 11, 2010

(30) Foreign Application Priority Data

Sep. 8, 2008  (JP) .................................. 2008-229897

(51) Int. Cl.
  *H01S 3/00*       (2006.01)
(52) U.S. Cl. ................ 372/38.02; 372/38.07; 372/38.01
(58) Field of Classification Search ............... 372/38.02, 372/38.07, 38.01
See application file for complete search history.

(56) References Cited

U.S. PATENT DOCUMENTS

| | | | |
|---|---|---|---|
| 5,736,881 A | 4/1998 | Ortiz | |
| 6,724,376 B2 * | 4/2004 | Sakura et al. | 345/204 |
| 2003/0016711 A1 | 1/2003 | Crawford | |
| 2005/0213622 A1 | 9/2005 | Diaz | |
| 2006/0133435 A1 * | 6/2006 | Ikeda | 372/38.02 |
| 2008/0165810 A1 | 7/2008 | Takeda | |

FOREIGN PATENT DOCUMENTS

| | | |
|---|---|---|
| JP | 2006-167322 A | 6/2005 |
| JP | 2006-251632 A | 9/2006 |
| JP | 2006-330138 A | 12/2006 |
| JP | 2007-188098 A | 7/2007 |
| JP | 2008-83727 A | 4/2008 |
| WO | WO 2005/069455 A2 | 7/2005 |

OTHER PUBLICATIONS

European Search Report dated Jan. 7, 2010 (six (6) pages).

* cited by examiner

*Primary Examiner* — Kinam Park
(74) *Attorney, Agent, or Firm* — Crowell & Moring LLP

(57) ABSTRACT

A laser driver circuit comprising a current supply circuit for supplying a laser diode with a current is provided. The current supply circuit comprises a voltage-to-current converter circuit, a current output line for outputting the current generated by the voltage-to-current converter circuit, a current supply line connected to the laser diode, a ground line connected to the ground, and a current path switch for selectively connecting either the current supply line or the ground line to the current output line. The laser driver circuit further comprises a current output prevention circuit for preventing the voltage-to-current converter circuit from generating the current by disconnecting the voltage input line using a voltage input switch so that the voltage is not input to the voltage-to-current converter circuit, when the current output line and the ground line are connected by the current path switch.

6 Claims, 4 Drawing Sheets

LASER DRIVER CIRCUIT AND LASER DISPLAY

BACKGROUND OF THE INVENTION

1. Field of the Invention

The present invention relates to a laser driver circuit which drives a laser diode, and a laser display which comprises the laser driver circuit.

2. Description of the Related Art

Conventionally, there is known a laser display which scans a laser beam across a screen in order to display images on the screen. The laser display comprises a laser driver circuit for driving a laser diode. The laser display drives a laser diode with the laser driver circuit so as to irradiate the screen with the laser beam. FIG. 5 illustrates an example of a conventional laser driver circuit.

A laser driver circuit 100 shown in FIG. 5 is a current drive type laser driver circuit which drives a laser diode 101 by supplying the laser diode 101 with a current. In order to drive the laser diode 101, the laser driver circuit 100 supplies the laser diode 101 with not only a threshold current from a current supply circuit 140-0 for supplying the threshold current but also a radiance control current from plural current supply circuits 140-1 to 140-8 for supplying the radiance control current. The above-described threshold current is defined as the minimum current necessary to make the laser diode 101 emit light. In other words, the threshold current is a current corresponding to a threshold voltage. The above-described radiance control current is defined as a current for adjusting radiance (or radiant intensity) of the laser diode 101.

In the current supply circuit 140-0 for supplying the threshold current, a threshold voltage output from a threshold voltage output circuit (T-voltage output) 147-0 is input to a voltage-to-current converter circuit 141-0 (V/C converter) via a voltage input line 146-0 so that the voltage-to-current converter circuit 141-0 generates the threshold current corresponding to the input threshold voltage. The generated threshold current is output via a current output supply line 142-0. The threshold current output via the current output supply line 142-0 is supplied to the laser diode 101.

In the current supply circuit 140-1 for supplying the radiance control current, a radiance voltage output circuit (R-voltage output) 147-1 generates a radiance control voltage based on a voltage supplied from a maximum voltage supply source 150 so as to input the radiance control voltage to a voltage-to-current converter circuit (V/C converter) 141-1 via a voltage input line 146-1. The voltage-to-current converter circuit 141-1 generates the radiance control current corresponding to the input radiance control voltage so as to output the radiance control current to a current output line 142-1. When the current output line 142-1 and a current supply line 143-1 are connected by a current path switch 145-1, the radiance control current running through the current output line 142-1 is supplied to the laser diode 101 via the current supply line 143-1. On the other hand, when the current output line 142-1 and an ground line 144-1 are connected by the current path switch 145-1, the radiance control current running through the current output line 142-1 flows to the ground via the ground line 144-1.

Similarly, in each of the current supply circuits 140-2 to 140-8 for supplying the radiance control currents, each of radiance voltage output circuits (R-voltage outputs) 147-2 to 147-8 generates each radiance control voltage based on the voltage supplied from the maximum voltage supply source 150 so as to input the each radiance control voltage to each of voltage-to-current converter circuits 141-2 to 141-8 (V/C converters) via each of voltage input lines 146-2 to 146-8. Each of the voltage-to-current converter circuits 141-2 to 141-8 generates each radiance control current corresponding to the input each radiance control voltage so as to output the each radiance control current to each of current output lines 142-2 to 142-8.

When each of the current output lines 142-2 to 142-8 and each of current supply lines 143-2 to 143-8 are connected by each of current path switches 145-2 to 145-8, the each radiance control current running through each of the current output lines 142-2 to 142-8 is supplied to the laser diode 101 via each of the current supply lines 143-2 to 143-8. On the other hand, when each of the current output lines 142-2 to 142-8 and each of ground lines 144-2 to 144-8 are connected by each of the current path switches 145-2 to 145-8, the each radiance control current running through each of the current output lines 142-1 to 142-8 flows to the ground via each of the ground lines 144-2 to 144-8.

Each radiance control voltage to be output by each of the radiance voltage output circuits 147-1 to 147-8 in each of the current supply circuits 140-1 to 140-8 is different from each other. Accordingly, each of the voltage-to-current converter circuits (V/C converters) 141-1 to 141-8 generates the radiance control current with each different current value.

The current output supply line 142-0 (in the current supply circuit 140-0) and each of the current supply lines 143-1 to 143-8 (in each of the current supply circuits 140-1 to 140-8) are connected in parallel. Accordingly, both the threshold current running through the current output supply line 142-0 and the radiance control currents running through the current supply lines 143-1 to 143-8 are converged (added) and supplied to the laser diode 101 in order to drive the laser diode 101.

Whether each of the current output lines 142-1 to 142-8 is connected to each of the current supply lines 143-1 to 143-8 or each of the ground lines 144-1 to 144-8 is switched by the current path switches 145-1 to 145-8. Thus, a value of the current supplied to the laser diode 101 can be changed, so that the radiance of the laser beam to be emitted by the laser diode 101 can be changed. The above-described switching using the current path switches 145-1 to 145-8 is controlled by a switch control circuit 170.

The switch control circuit 170 controls the current path switches 145-1 to 145-8 so as to control switching whether each of the current output lines 142-1 to 142-8 is connected to each of the current supply lines 143-1 to 143-8 or each of the ground lines 144-1 to 144-8. Thus, a value of the current supplied to the laser diode 101 can be controlled, so that the radiance of the laser beam to be emitted by the laser diode 101 can be controlled.

However, in order to enable the radiance of the laser beam to be emitted by the laser diode 101 to be rapidly controlled, the conventional laser driver circuit 100 cuts the radiance control current(s) to the laser diode 101 without halting voltage-to-current convert function of the voltage-to-current converter circuit(s) in current supply circuit(s), which do (does) not supply the radiance control current(s), out of the current supply circuits 140-1 to 140-8. More specially, in the current supply circuit(s) which do (does) not supply the radiance control current(s), the conventional laser driver circuit 100 cuts the radiance control current(s) to the laser diode 101 by connecting the current output line(s) to the ground line(s). In other words, in the current supply circuit(s) which do (does) not supply the radiance control current(s), the conventional laser driver circuit 100 keeps not only generating the radiance control current(s) using the voltage-to-current converter circuit(s), but also sending the generated radiance control current(s) to the ground so as not to supply the laser diode 101 with the radiance control current(s). Thus, the conventional laser driver circuit 100 generates and outputs wasteful currents which do not contribute to emission of the laser diode 101, and thereby requires a large amount of power.

SUMMARY OF THE INVENTION

An object of the present invention is to provide a laser driver circuit which can drive a laser diode without high power consumption, and a laser display which comprises the laser driver circuit.

According to a first aspect of the present invention, this object is achieved by a laser driver circuit which supplies a laser diode with a current so as to drive the laser diode.

The laser driver circuit comprises a current supply circuit for supplying the laser diode with the current.

The current supply circuit comprises a voltage-to-current converter circuit for converting an input voltage to the current so as to generate the current, a current output line which is connected to the voltage-to-current converter circuit, and which outputs the current generated by the voltage-to-current converter circuit, a current supply line which is connected to the laser diode, and which supplies the laser diode with the current generated by the voltage-to-current converter circuit, a ground line connected to the ground, and a current path switch for selectively connecting either the current supply line or the ground line to the current output line.

The current which is output from the voltage-to-current converter circuit, and which is running through the current output line, the current path switch and the current supply line is supplied to the laser diode so as to drive the laser diode.

The laser driver circuit further comprises a current output prevention circuit for preventing the voltage-to-current converter circuit from generating the current and preventing the current from being output from the current output line, when the current output line and the ground line are connected by the current path switch.

With the above configuration, when the current output line and the ground line are connected (when the voltage-to-current converter circuit does not supply the current to the laser diode), the current output prevention circuit can prevent the voltage-to-current converter circuit from generating the current so as to prevent the current from being output from the current output line. Thus, when the voltage-to-current converter circuit does not supply the current to the laser diode, the possibility can be reduced that an unnecessary current which does not contribute to the light emission of the laser diode is generated by the voltage-to-current converter circuit and flows to the ground. Accordingly, compared to a conventional laser driver circuit, the laser driver circuit can reduce power consumption, thereby can drive the laser diode with lower power consumption.

Preferably, the current supply circuit further comprises a voltage input line which is connected to the voltage-to-current converter circuit, and which inputs a voltage to the voltage-to-current converter circuit. Therein the current output prevention circuit further comprises a voltage input switch for switching between connection and disconnection of the voltage input line. And therein by disconnecting the voltage input line using the voltage input switch so that the voltage is not input to the voltage-to-current converter circuit, the current output prevention circuit prevents the voltage-to-current converter circuit from generating the current.

With this configuration, by a simple structure where the voltage input line is disconnected by the voltage input switch, the current output prevention circuit is realized. Furthermore, because the laser driver circuit employs the structure where the voltage input line is connected or disconnected by the voltage input switch, a current fall time and a current rise time of the current to be output from the current output line can be shortened, compared to the case where voltage-to-current convert function of the voltage-to-current converter circuit is halted or restarted. Thus, not only rapid control of the radiance of the laser beam to be emitted from the laser diode but also reducing power consumption can be realized.

More preferably, when the period during which the current output line is connected to the ground line by the current path switch is longer than the sum of a current fall time and a current rise time, the current output prevention circuit disconnects the voltage input line using the voltage input switch so that the voltage is not input to the voltage-to-current converter circuit. Therein the current fall time is a period during which the current to be output from the current output line decays to zero, when the voltage input line has been disconnected by the voltage input switch. And therein the current rise time is a period during which the current to be output from the current output line rises from zero level to the steady-state current level, when the voltage input line has been connected by the voltage input switch.

Thus, when the current output line is connected to the current supply line again after being connected to the ground line, the current which is output from the current output line so as to be supplied to the laser diode is not the changing (increasing) current during the current rise time, but the stable (steady-state) current with a constant value after the current rise time. Accordingly, when the current output line is connected to the current supply line again after being connected to the ground line, the radiance of the laser beam to be emitted by the laser diode can be made constant.

The number of the current supply circuits can be plural. Therein the currents running through the current supply lines of the current supply circuits are converged and supplied to the laser diode so as to drive the laser diode. And therein when the current output line and the ground line are connected by the current path switch in any of the current supply circuits, the current output prevention circuit prevents the voltage-to-current converter circuit from generating the current in the current supply circuit in which the current output line and the ground line are connected.

According to a second aspect of the present invention, this object is achieved by a laser display which scans a laser beam across a screen so as to display an image on the screen.

The laser display comprises a laser diode for emitting the laser beam, a laser driver circuit which supplies the laser diode with a current so as to drive the laser diode, and a scanning means for scanning the laser beam emitted by the laser diode across the screen.

The laser display displays the image on the screen not only by controlling scanning of the scanning means to control a laser beam irradiated position on the screen, but also by controlling driving of the laser diode using the laser driver circuit so as to control the radiance of the laser beam to be irradiated on the screen.

The laser driver circuit comprises a current supply circuit for supplying the laser diode with the current.

The current supply circuit comprises: a voltage-to-current converter circuit for converting an input voltage to the current so as to generate the current, a current output line which is connected to the voltage-to-current converter circuit, and which outputs the current generated by the voltage-to-current converter circuit, a current supply line which is connected to the laser diode, and which supplies the laser diode with the current generated by the voltage-to-current converter circuit, a ground line connected to the ground, and a current path switch for selectively connecting either the current supply line or the ground line to the current output line.

The current which is output from the voltage-to-current converter circuit, and which is running through the current output line, the current path switch and the current supply line is supplied to the laser diode so as to drive the laser diode.

The laser driver circuit further comprises a current output prevention circuit for preventing the voltage-to-current converter circuit from generating the current and preventing the current from being output from the current output line, when the current output line and the ground line are connected by the current path switch.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein.

DESCRIPTION OF THE PREFERRED EMBODIMENTS

Referring now to the accompanying drawings, a preferred embodiment of the present invention is described. The present invention relates to a laser driver circuit which drives a laser diode, and a laser display which comprises the laser driver circuit. It is to be noted that the following description of preferred embodiment of the present invention has been presented for purposes of illustration and description, and is not intended to be exhaustive or to limit the present invention to the precise form disclosed.

Figure 1:
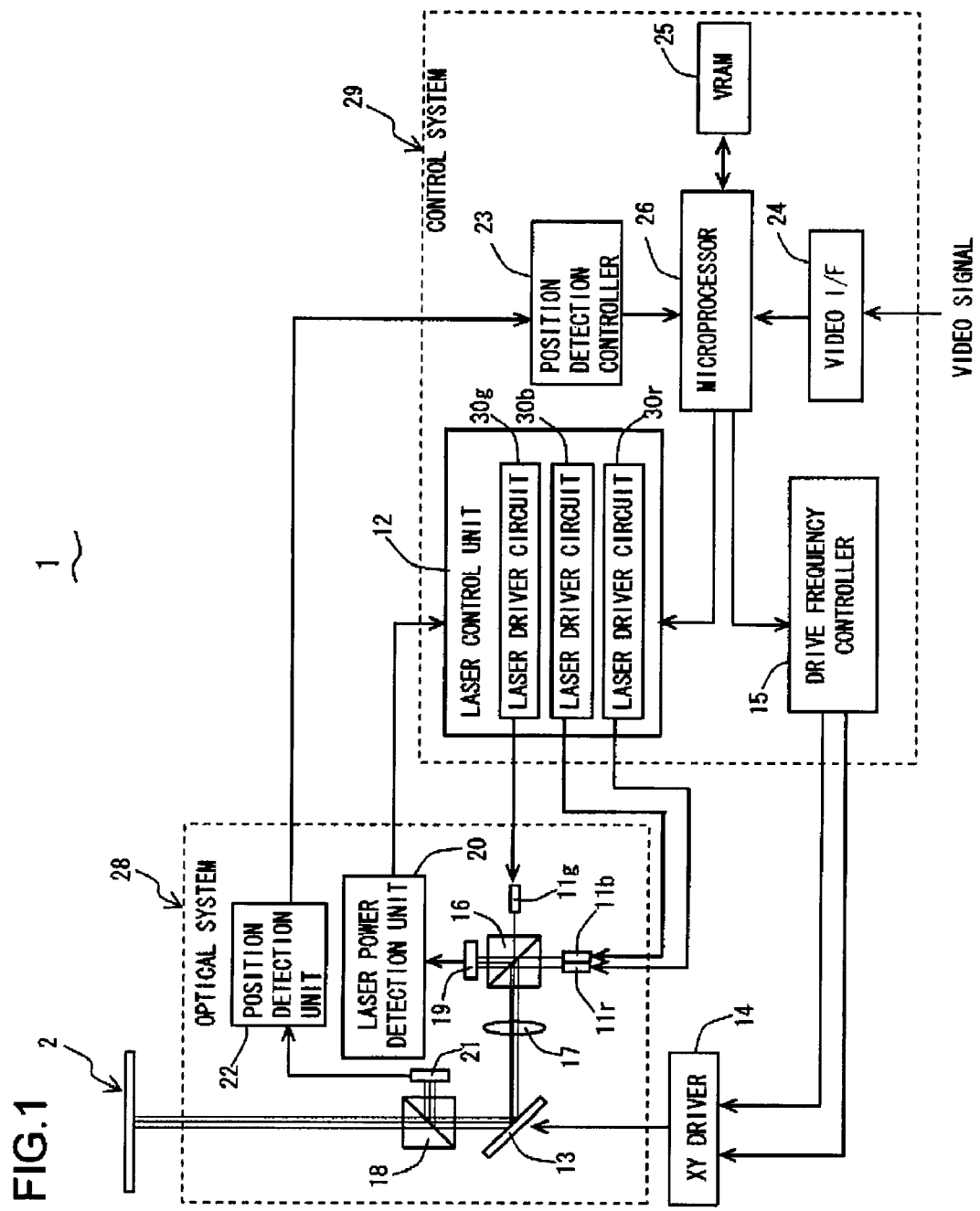
FIG. 1 is a schematic block diagram of a laser display which comprises a laser driver circuit according to an embodiment of the present invention.

FIG. 1 shows a schematic block diagram of a laser display 1 which comprises laser driver circuits 30g, 30b, 30r according to this embodiment. The laser display 1 scans a laser beam across a screen 2 in order to display images on the screen 2.

The laser display 1 comprises laser diodes 11r, 11b, 11g which emit laser beams, a laser control unit 12 for controlling light emission of the laser diodes 11r, 11b, 11g, an XY scanning mirror 13 for scanning the laser beams emitted by the laser diodes 11r, 11b, 11g across the screen 2, an XY driver 14 for driving the XY scanning mirror 13, and a drive frequency controller 15 for controlling drive frequency of the XY scanning mirror 13.

The laser display 1 further comprises a first half mirror 16, a collimator lens 17, a second half mirror 18, a first photodetector 19, a laser power detection unit 20, a second photodetector 21, a position detection unit 22, a position detection controller 23, a video interface circuit (video I/F) 24, a VRAM (video RAM) 25, and a microprocessor 26 for controlling each component in the laser display 1.

An optical system 28 is made up of the laser diodes 11r, 11b, 11g, the XY scanning mirror 13, the first half mirror 16, the collimator lens 17, the second half mirror 18, the first photodetector 19, the laser power detection unit 20, the second photodetector 21, and the position detection unit 22. An control system 29 is made up of the laser control unit 12, the drive frequency controller 15, the position detection controller 23, the video interface circuit 24, the VRAM 25, and the microprocessor 26.

The laser diode 11r is one which emits a red laser beam. The laser diode 11b is one which emits a blue laser beam. The laser diode 11g is one which emits a green laser beam. When a current is supplied to each of the laser diodes 11r, 11b, 11g, each of them emits a laser beam with radiance depending on a value of the supplied current.

The laser control unit 12 comprises current drive type laser driver circuits 30r, 30b, 30g each of which drives each of the laser diodes 11r, 11b, 11g. The laser driver circuit 30r is one which supplies the current to the laser diode 11r so as to drive the laser diode 11r. The laser driver circuit 30b is one which supplies the current to the laser diode 11b so as to drive the laser diode 11b. The laser driver circuit 30g is one which supplies the current to the laser diode 11g so as to drive the laser diode 11g. Each of the laser driver circuits 30r, 30b, 30g does the above-described processing under the control of microprocessor 26.

The XY scanning mirror 13 which is rotatable about two different axises reflects the laser beams emitted from the laser diodes 11r, 11b, 11g. The XY driver 14 drives the XY scanning mirror 13 so as to rotate the XY scanning mirror 13 about the two different axises at a constant frequency. The drive frequency controller 15 sets the drive frequency (a rotation cycle) of the XY scanning mirror 13.

The first half mirror 16 reflects a part of the laser beams emitted from the laser diodes 11r, 11b, and transmits another part of the laser beams emitted from the laser diodes 11r, 11b. Similarly, the first half mirror 16 reflects a part of the laser beam emitted from the laser diode 11g, and transmits another part of the laser beam emitted from the laser diode 11g.

The collimator lens 17 collimates not only the laser beams which are emitted from the laser diodes 11r, 11b and reflected by the first half mirror 16, but also the laser beam which is emitted from the laser diode 11g and transmitted by the first half mirror 16. The laser beams collimated by the collimator lens 17 are reflected by the XY scanning mirror 13.

The second half mirror 18 transmits a part of the laser beams reflected by the XY scanning mirror 13, and reflects another part of the laser beams reflected by the XY scanning mirror 13. The laser beams transmitted by the second half mirror 18 are emitted from the laser display 1 so as to be irradiated on the screen 2.

The XY scanning mirror 13 is driven and rotated by the XY driver 14. Thus, not only the direction of the laser beams reflected by the XY scanning mirror 13 but also the direction of the laser beams emitted from the laser display 1 are changed so that the laser beams emitted from the laser display 1 are scanned across the screen 2. The XY scanning mirror 13 and the XY driver 14 correspond to claimed scanning means. The XY scanning mirror 13 and the XY driver 14 scan the laser beams emitted from the laser diodes 11r, 11b, 11g across the screen 2.

The first photodetector 19 receives not only the laser beams which are emitted from the laser diodes 11r, 11b and transmitted by the first half mirror 16, but also the laser beam which is emitted from the laser diode 11g and reflected by the first half mirror 16, and then outputs an output voltage corresponding to the light intensity of the received laser beams. The laser power detection unit 20 detects the emitted light intensity (radiance) of the laser beams emitted from the laser diodes 11r, 11b, 11g based on the output voltage output from the first photodetector 19 so as to send the detected result to the laser control unit 12.

The second photodetector 21 receives the laser beams reflected by the second half mirror 18, and then outputs an output voltage corresponding to an incident position of the laser beams which are reflected to the second photodetector 21 by the second half mirror 18. The position detection unit 22 detects a rotational position of the XY scanning mirror 13 based on the output voltage of the second photodetector 21 so as to send the detected result to the position detection controller 23. The position detection controller 23 detects a laser beam irradiated position on the screen 2 based on the detected result of the position detection unit 22 so as to send the detected result to the microprocessor 26.

The video interface circuit 24 receives a video signal. The VRAM 25 stores various programs and data for controlling each component in the laser display 1. Further, under the control of microprocessor 26, the VRAM 25 stores temporarily pixel brightness values of an image based on the video signal received by the video interface circuit 24.

Under the control of microprocessor 26, the laser display 1 having the above-described configuration controls scanning of the XY scanning mirror 13 so as to control the laser beam irradiated position on the screen 2. Additionally, the laser display 1 controls driving of the laser diodes 11r, 11b, 11g using the laser driver circuits 30g, 30b, 30r so as to control the radiance of the laser beam to be irradiated on the screen 2, thereby displaying images on the screen 2.

Figure 2:
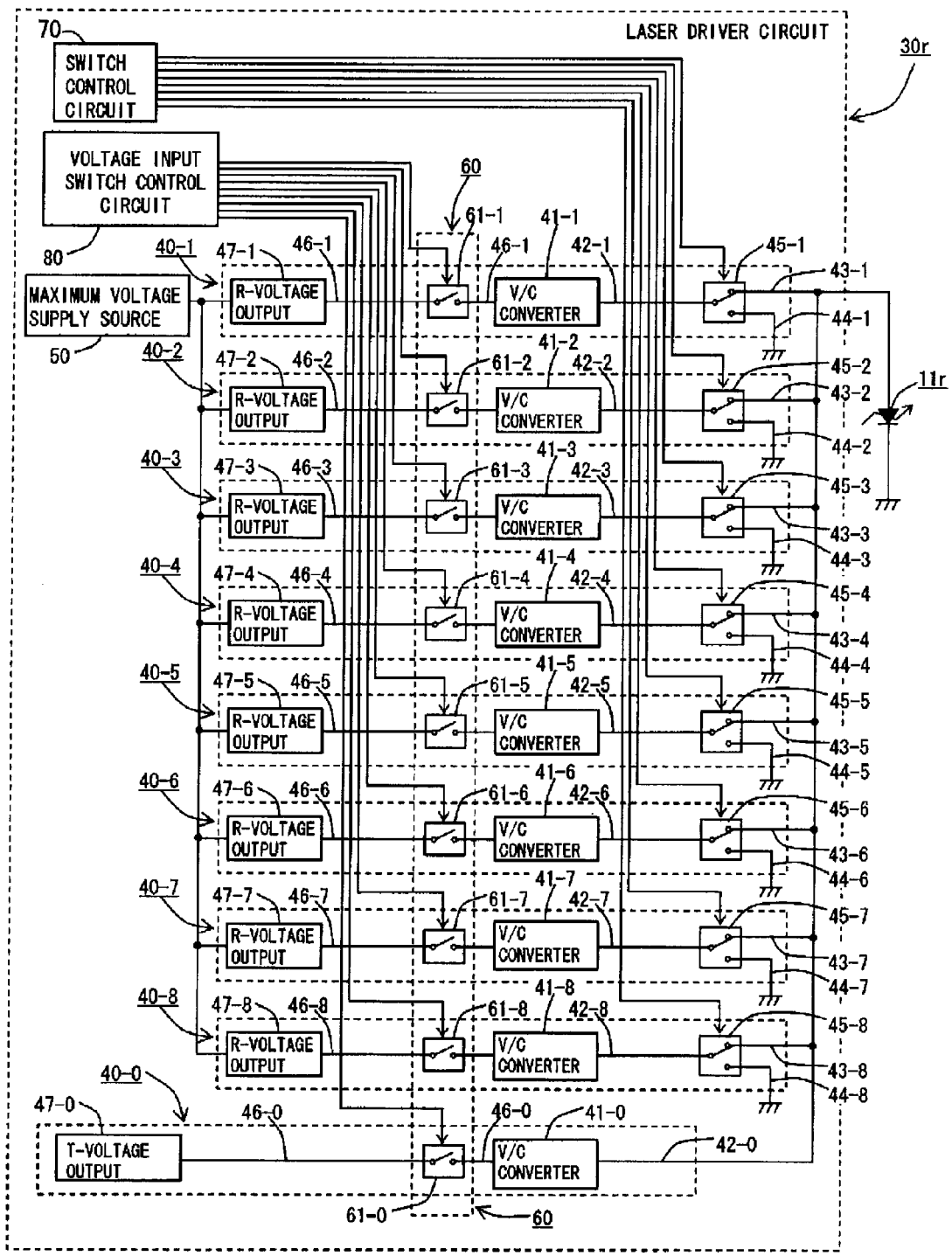
FIG. 2 is a schematic circuit diagram of the laser driver circuit.

FIG. 2 shows a schematic circuit diagram of the laser driver circuit 30r. Each of the laser driver circuits 30g, 30b shown in FIG. 1 has same circuit configuration as the laser driver circuit 30r. The circuit configuration of the laser driver circuit 30r is described below.

The laser driver circuit 30r is a current drive type laser driver circuit which drives the laser diode 11r by supplying the laser diode 11r with a current. The laser driver circuit 30r comprises a current supply circuit 40-0 for supplying a threshold current, plural (eight) current supply circuits 40-1 to 40-8 for supplying radiance control currents, a maximum voltage supply source 50, a current output prevention circuit 60, a switch control circuit 70, and a voltage input switch control circuit 80.

The current supply circuit 40-0 is a circuit for supplying the threshold current to the laser diode 11r. The threshold current is defined as the minimum current necessary to make the laser diode 11r emit light. The current supply circuit 40-0 for supplying the threshold current comprises a voltage-to-current converter circuit (V/C converter) 41-0, a current output supply line 42-0, a voltage input line 46-0, and a threshold voltage output circuit (T-voltage output) 47-0.

The voltage-to-current converter circuit 41-0 is a circuit for converting an input voltage to a current in order to generate the current. The current output supply line 42-0 is a line for outputting the current generated by the voltage-to-current converter circuit 41-0 in order to supply the laser diode 11r with the current. The current output supply line 42-0 connects between the voltage-to-current converter circuit 41-0 and the laser diode 11r.

The voltage input line 46-0 connected to the voltage-to-current converter circuit 41-0 is a line for inputting a voltage to the voltage-to-current converter circuit 41-0. The threshold voltage output circuit 47-0 connected to the voltage input line 46-0 is a circuit for outputting the voltage to be input to the voltage-to-current converter circuit 41-0. The threshold voltage output circuit 47-0 outputs a threshold voltage to the voltage input line 46-0 so that the voltage-to-current converter circuit 41-0 generates the threshold current based on the input threshold voltage.

The threshold voltage output from the threshold voltage output circuit 47-0 is input to the voltage-to-current converter circuit 41-0 via the voltage input line 46-0 so that the voltage-to-current converter circuit 41-0 generates the threshold current corresponding to the input threshold voltage. The generated threshold current is output via the current output supply line 42-0. The threshold current output via the current output supply line 42-0 is supplied to the laser diode 11r.

The current supply circuits 40-1 to 40-8 are circuits for supplying the radiance control currents to the laser diode 11r. The radiance control currents are defined as currents for adjusting radiance (or radiant intensity) of the laser diode 11r.

The current supply circuit 40-1 for supplying the radiance control current comprises a voltage-to-current converter circuit (V/C converter) 41-1, a current output line 42-1, a current supply line 43-1, an ground line 44-1, a current path switch 45-1, a voltage input line 46-1, a radiance voltage output circuit (R-voltage output) 47-1.

The voltage-to-current converter circuit 41-1 is a circuit for converting an input voltage to a current in order to generate the current. The current output line 42-1 connected to the voltage-to-current converter circuit 41-1 is a line for outputting the current generated by the voltage-to-current converter circuit 41-1. The current supply line 43-1 connected to the laser diode 11r is a line for supplying the laser diode 11r with the current generated and output to the current output line 42-1 by the voltage-to-current converter circuit 41-1. The ground line 44-1 connected to the ground is a line through which the current generated and output to the current output line 42-1 by the voltage-to-current converter circuit 41-1 flows to the ground. The current path switch 45-1 is a switch for selectively connecting either the current supply line 43-1 or the ground line 44-1 to the current output line 42-1.

The voltage input line 46-1 connected to the voltage-to-current converter circuit 41-1 is a line for inputting a voltage to the voltage-to-current converter circuit 41-1. The radiance voltage output circuit 47-1 connected to the voltage input line 46-1 is a circuit for outputting the voltage to be input to the voltage-to-current converter circuit 41-1. The radiance voltage output circuit 47-1 generates a radiance control voltage based on a voltage supplied from a maximum voltage supply source 50 so as to output the radiance control voltage to the voltage input line 46-1.

The radiance control voltage output from the radiance voltage output circuit 47-1 is input to the voltage-to-current converter circuit 41-1 via the voltage input line 46-1 so that the voltage-to-current converter circuit 41-1 generates a radiance control current corresponding to the input radiance control voltage so as to output the radiance control current to a current output line 42-1. When the current output line 42-1 and the current supply line 43-1 are connected by a current path switch 45-1, the radiance control current running through the current output line 42-1 is supplied to the laser diode 11r via the current supply line 43-1. On the other hand, when the current output line 42-1 and the ground line 44-1 are connected by the current path switch 45-1, the radiance control current running through the current output line 42-1 flows to the ground via the ground line 44-1.

The current supply circuit 40-2 for supplying the radiance control current comprises a voltage-to-current converter circuit (V/C converter) 41-2, a current output line 42-2, a current supply line 43-2, a ground line 44-2, a current path switch 45-2, a voltage input line 46-2, and a radiance voltage output circuit (R-voltage output) 47-2. The current supply circuit 40-2 has same circuit configuration as the current supply circuit 40-1.

The current supply circuits 40-3 to 40-8 for supplying the radiance control currents comprise respective voltage-to-current converter circuits (V/C converters) 41-3 to 41-8, respective current output lines 42-3 to 42-8, respective current supply lines 43-3 to 43-8, ground lines 44-3 to 44-8, current path switches 45-3 to 45-8, voltage input lines 46-3 to 46-8, radiance voltage output circuits (R-voltage outputs) 47-3 to 47-8. Each of the current supply circuits 40-3 to 40-8 has same circuit configuration as the current supply circuit 40-1.

However, each radiance control voltage to be output by each of the radiance voltage output circuits 47-1 to 47-8 in each of the current supply circuits 40-1 to 40-8 is different from each other. Accordingly, each of the voltage-to-current converter circuits (V/C converters) 41-1 to 41-8 in each of the current supply circuits 40-1 to 40-8 generates the radiance control current with each different current value.

The current output supply line 42-0 (in the current supply circuit 40-0) and each of the current supply lines 43-1 to 43-8 (in each of the current supply circuits 40-1 to 40-8) are connected in parallel. Accordingly, both the threshold current running through the current output supply line 42-0 and the radiance control currents running through the current supply lines 43-1 to 43-8 are converged (added) and supplied to the laser diode 11r in order to drive the laser diode 11r.

The current output prevention circuit 60 has plural (9) voltage input switches 61-0, 61-1, 61-2, 61-3, 61-4, 61-5, 61-6, 61-7, and 61-8 which correspond to the current supply circuit 40-0, 40-1, 40-2, 40-3, 40-4, 40-5, 40-6, 40-7, and 40-8, respectively.

The voltage input switches 61-0 on the voltage input line 46-0 is a switch for switching between connection and disconnection of the voltage input line 46-0 in the current supply circuit 40-0 for supplying the threshold current. The voltage input switch 61-1 on the voltage input line 46-1 is a switch for switching between connection and disconnection of the voltage input line 46-1 in the current supply circuit 40-1 for supplying the radiance control current. Similarly, the voltage input switches 61-2, 61-3, 61-4, 61-5, 61-6, 61-7, and 61-8 on the voltage input lines 46-2 to 46-8 are switches for switching between connection and disconnection of the voltage input line 46-2, 46-3, 46-4, 46-5, 46-6, 46-7, and 46-8, respectively.

When the voltage input switch 61-0 is closed, the threshold voltage output from the threshold voltage output circuit 47-0 is input to the voltage-to-current converter circuit 41-0 via the voltage input line 46-0 so that the voltage-to-current converter circuit 41-0 generates the threshold current corresponding to the input threshold voltage. The generated threshold current is output via the current output supply line 42-0. On the other hand, when the voltage input switch 61-0 is opened, the threshold voltage is not input to the voltage-to-current converter circuit 41-0. Accordingly, the voltage-to-current converter circuit 41-0 does not generate the threshold current, thereby the threshold current is not output via the current output supply line 42-0.

When the voltage input switch 61-1 is closed, the radiance control voltage output from the radiance voltage output circuit 47-1 is input to the voltage-to-current converter circuit 41-1 via the voltage input line 46-1 so that the voltage-to-current converter circuit 41-1 generates the radiance control current so as to output the radiance control current to the current output line 42-1. On the other hand, when the voltage input switch 61-1 is opened, the radiance control voltage is not input to the voltage-to-current converter circuit 41-1. Accordingly, the voltage-to-current converter circuit 41-1 does not generate the radiance control current, thereby the radiance control current is not output via the current output line 42-1.

Similarly, when the voltage input switches 61-2, 61-3, 61-4, 61-5, 61-6, 61-7, and 61-8 are closed, the radiance control voltages are input to the voltage-to-current converter circuits 41-2, 41-3, 41-4, 41-5, 41-6, 41-7, and 41-8, respectively. Thus, the voltage-to-current converter circuits 41-2, 41-3, 41-4, 41-5, 41-6, 41-7, and 41-8 generate the radiance control currents so as to output the radiance control currents to the current output lines 42-2, 42-3, 42-4, 42-5, 42-6, 42-7, and 42-8, respectively. On the other hand, when the voltage input switches 61-2, 61-3, 61-4, 61-5, 61-6, 61-7, and 61-8 are opened, the radiance control voltages are not input to the voltage-to-current converter circuits 41-2, 41-3, 41-4, 41-5, 41-6, 41-7, and 41-8, respectively. Accordingly, each of the voltage-to-current converter circuits 41-2 to 41-8 does not generate the radiance control current, thereby the radiance control current is not output via each of the current output lines 42-2 to 42-8.

The voltage input switches 61-0 in the current output prevention circuit 60 disconnects the voltage input line 46-0 in the current supply circuit 40-0 for supplying the threshold current so that the threshold voltage is not input to the voltage-to-current converter circuit 41-0 in the current supply circuit 40-0 for supplying the threshold current. Thus, the voltage input switch 61-0 prevents the voltage-to-current converter circuit 41-0 in the current supply circuit 40-0 from generating the threshold current and prevents the threshold current from being output from the current output supply line 42-0.

The voltage input switch 61-1, 61-2, 61-3, 61-4, 61-5, 61-6, 61-7, and 61-8 in the current output prevention circuit 60 disconnect the voltage input line 46-1, 46-2, 46-3, 46-4, 46-5, 46-6, 46-7, and 46-8, respectively so that the radiance control voltage is not input to each of the voltage-to-current converter circuits 41-1 to 41-8 in the current supply circuits 40-1 to 40-8 for supplying the radiance control currents. Thus, the voltage input switches 61-1, 61-2, 61-3, 61-4, 61-5, 61-6, 61-7, and 61-8 prevent the voltage-to-current converter circuits 41-1, 41-2, 41-3, 41-4, 41-5, 41-6, 41-7, and 41-8, respectively from generating the radiance control currents, and prevents the radiance control currents from being output.

The switch control circuit 70 controls the current path switches 45-1 to 45-8 so as to control switching whether each of the current output lines 42-1 to 42-8 is connected to each of the current supply lines 43-1 to 43-8 or each of the ground lines 44-1 to 44-8.

The voltage input switch control circuit 80 controls the voltage input switches 61-1 to 61-8 in the current output prevention circuit 60 so as to control switching between connection and disconnection of the voltage input lines 46-0 to 46-8.

As described above, the switch control circuit 70 controls switching whether each of the current output lines 42-1 to 42-8 is connected to each of the current supply lines 43-1 to 43-8 or each of the ground lines 44-1 to 44-8. Additionally, the voltage input switch control circuit 80 controls switching between connection and disconnection of the voltage input lines 46-0 to 46-8 using the voltage input switches 61-0 to 61-8. Thus, a value of the current supplied to the laser diode 11r can be controlled, so that the radiance of the laser beam to be emitted by the laser diode 11r can be controlled.

In the laser driver circuit 30r having the above-described configuration, the switch control circuit 70 receives an output gradation signal from the microprocessor 26. Based on this output gradation signal, the switch control circuit 70 controls the current path switches 45-1 to 45-8 in the current supply circuits 40-1 to 40-8 for supplying the radiance control currents. Additionally, the voltage input switch control circuit 80 receives a voltage off channel signal from the microprocessor 26 so as to control the voltage input switches 61-1 to 61-8 in the current output prevention circuit 60 based on the received voltage off channel signal.

The output gradation signal is a signal showing the radiance of the laser beam to be emitted by the laser diode 11*r*. This signal is used for switching whether each of the current output lines 42-1 to 42-8 is connected to each of the current supply lines 43-1 to 43-8 or each of the ground lines 44-1 to 44-8. The voltage off channel signal is a signal showing whether each of the voltage input lines 46-0 to 46-8 is connected or disconnected.

The output gradation signal is generated by the microprocessor 26 as described below. The microprocessor 26 determines a pixel brightness value of each pixels in an image to be displayed based on the video signal received by the video interface circuit 24, and then generates the output gradation signal corresponding to the determined pixel brightness value based on the pixel brightness value.

In the present embodiment, the microprocessor 26 expresses the pixel brightness value in eight bit binary data "xxxxxxxx" (x=0 or 1), because each of the laser driver circuits 30*g*, 30*b*, 30*r* comprises eight current supply circuits 40-1 to 40-8 for supplying radiance control currents.

Each bit in the above-described pixel brightness value "xxxxxxxx" corresponds to each of the current supply circuits 40-1 to 40-8 for supplying the radiance control currents. Each bit value (0 or 1) in the pixel brightness value "xxxxxxxx" corresponds to whether each of the current output lines 42-1 to 42-8 is connected to each of the current supply lines 43-1 to 43-8 or each of the ground lines 44-1 to 44-8.

In other words, most significant bit (MSB) of the pixel brightness value "xxxxxxxx" corresponds to the current supply circuits 40-1. Similarly, the second significant bit, the third significant bit, the fourth significant bit, the fifth significant bit, the sixth significant bit, the seventh significant bit, and the least significant bit correspond to the current supply circuits 40-2, 40-3, 40-4, 40-5, 40-6, 40-7, and 40-8, respectively.

A value "1" in each bit of the pixel brightness value "xxxxxxxx" corresponds to connection between each of the current output lines 42-1 to 42-8 and each of the current supply lines 43-1 to 43-8 in the current supply circuits 40-1 to 40-8. On the other hand, a value "0" in each bit of the pixel brightness value corresponds to connection between each of the current output lines 42-1 to 42-8 and each of the ground lines 44-1 to 44-8.

The microprocessor 26 determines or calculates the pixel brightness value of a few pixels ahead of the pixel irradiated by the laser diode 11*r* at the time based on the video signal received by the video interface circuit 24 so as to make the VRAM 25 store pixel brightness value.

The microprocessor 26 generates the output gradation signal corresponding to the pixel brightness value stored in the VRAM 25 so as to output the output gradation signal to the switch control circuit 70 with each pixel clock cycle (a cycle for controlling the radiance of the laser beam to be emitted from the laser diode 11*r* for each pixel of an image to be displayed).

The voltage off channel signal is generated by the microprocessor 26 as described below. The microprocessor 26 analyzes the pixel brightness value stored in the VRAM 25 so as to determine whether or not the period during which each of the current output lines 42-1 to 42-8 is connected to each of the ground lines 44-1 to 44-8 can be longer than the sum (tf+tr) of a current fall time tf and a current rise time tr in each of the current supply circuits 40-1 to 40-8 for supplying the radiance control currents.

Figure 3:
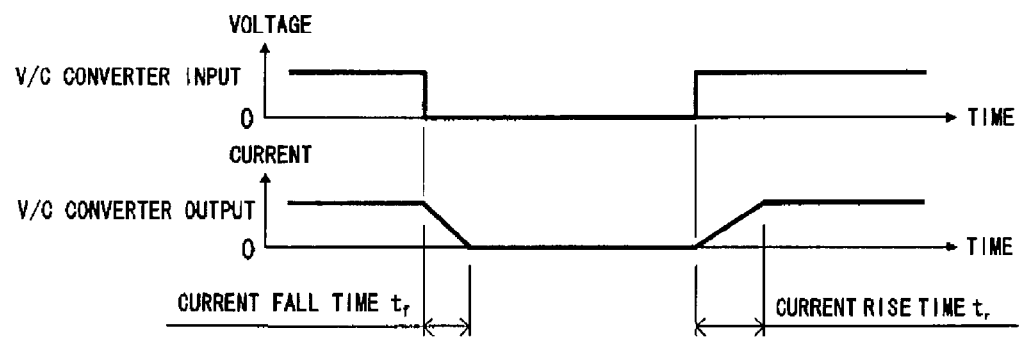
FIG. 3 is a diagram showing relationship between a V/C converter input and a V/C converter output of a voltage-to-current converter circuit in the laser driver circuit.

As shown in FIG. 3, the current fall time tf is a pulse fall time of a current to be output from each of the current output lines 42-1 to 42-8 when each of the voltage input lines 46-1 to 46-8 is disconnected by each of the voltage input switches 61-1 to 61-8. In other words, the current fall time tf is the period during which a V/C converter output (a current to be output from each of the voltage-to-current converter circuits 41-1 to 41-8) decays to zero, when each of the voltage input lines 46-1 to 46-8 is disconnected (opened) so that a V/C converter input (a voltage to be input to each of the voltage-to-current converter circuits 41-1 to 41-8 via each of the voltage input lines 46-1 to 46-8) becomes zero.

On the other hand, the current rise time tr is a pulse rise time of a current to be output from each of the current output lines 42-1 to 42-8 when each of the voltage input lines 46-1 to 46-8 is connected by each of the voltage input switches 61-1 to 61-8. In other words, the current rise time tr is the period during which the V/C converter output (current) rises from zero level to the steady-state current level, when each of the voltage input lines 46-1 to 46-8 is connected (closed) so that the V/C converter input (voltage value) becomes a predetermined value (the steady-state current value).

Figure 4:
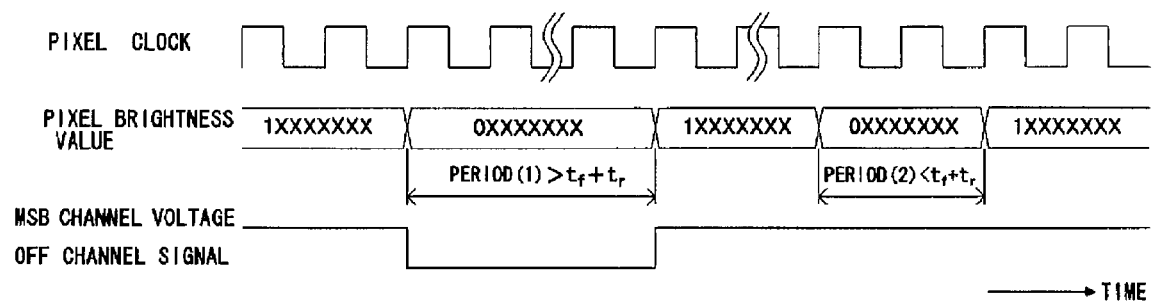
FIG. 4 is a diagram showing relationship between a pixel brightness value and a voltage off channel signal.
Figure 5:
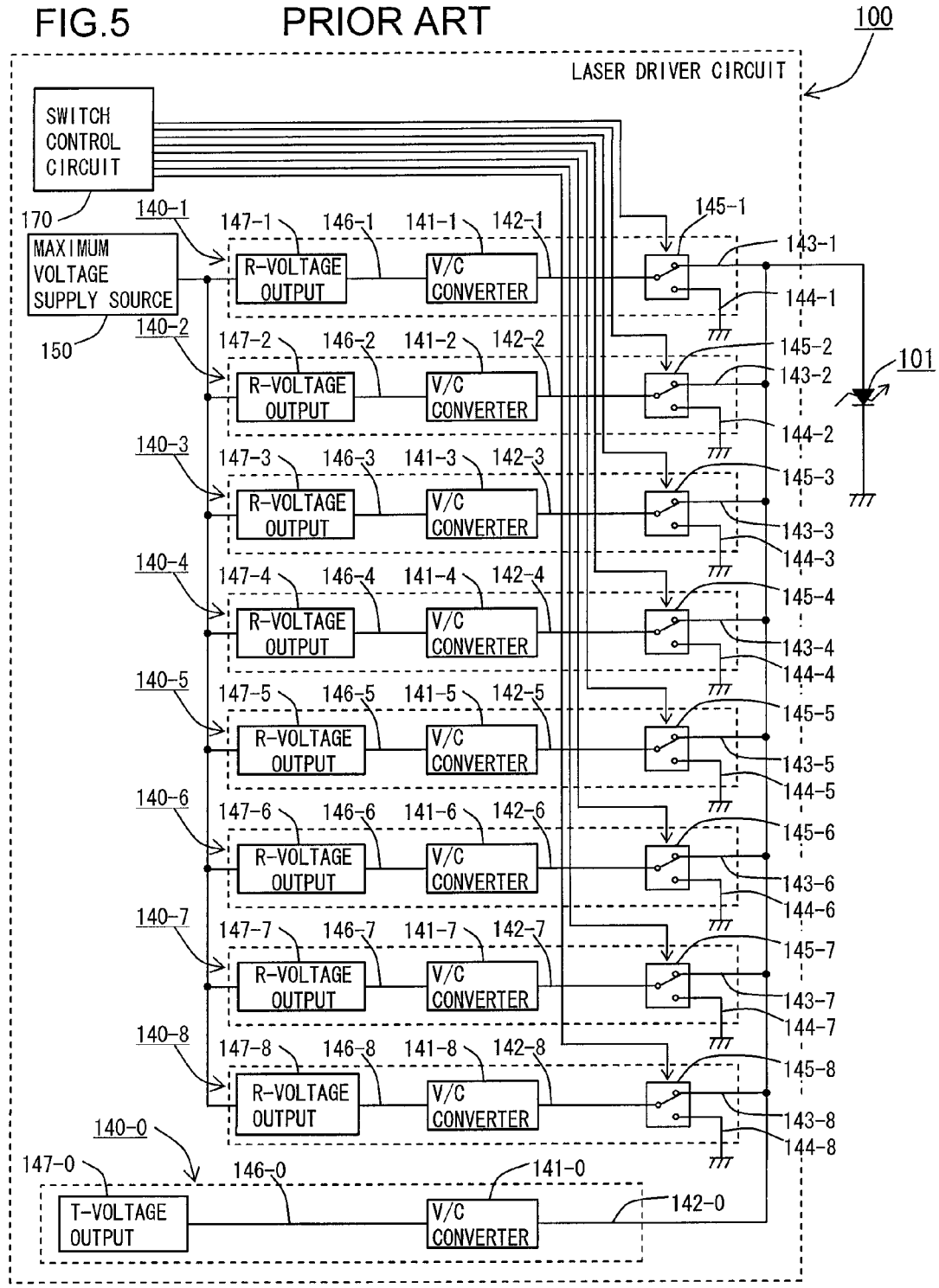
FIG. 5 is a schematic circuit diagram of a conventional laser driver circuit.

Determination whether or not the period during which the current output line 42-1 is connected to the ground line 44-1 can be longer than the sum (tf+tr) of the current fall time tf and the current rise time tr is done as described below. As shown in FIG. 4, the above-described determination is done based on whether or not there is the case where the pixel brightness value "0xxxxxxx" (x=0 or 1) whose most significant bit value is "0" continues longer than the sum (tf+tr) of the current fall time tf and the current rise time tr. The case where the pixel brightness value "0xxxxxxx" continues longer than the sum (tf+tr) is one where the pixel brightness value "0xxxxxxx" continues longer than output period (period corresponding "tf+tr") of a predetermined number of pixel clock pulses. In other words, the case is one where the pixel brightness value "0xxxxxxx" continues during more than a predetermined number of pixel clock cycles.

Determination whether or not the period during which the current output line 42-2 is connected to the ground line 44-2 can be longer than the sum (tf+tr) is done as described below. The above-described determination is done based on whether or not there is the case whether the pixel brightness value "x0xxxxxx" whose second significant bit value is "0" continues longer than the sum (tf+tr). Similarly, determination whether or not the periods during which each of the current output lines 42-3 to 42-8 is connected to each of the ground lines 44-3 to 44-8 can be longer than the sum (tf+tr) is done as described below. The above-described determination is done based on whether or not there is the case whether the pixel brightness value whose third, fourth, fifth, sixth, seventh, or least significant bit value is "0" continues longer than the sum (tf+tr).

Based on these determination result (the result of the determination whether or not the period during which each of the current output lines 42-3 to 42-8 is connected to each of the ground lines 44-3 to 44-8 continues longer than the sum (tf+tr) of the current fall time tf and the current rise time tr), the microprocessor 26 generates the voltage off channel signal.

When there is no case where the period during which the current output line 42-1 is connected to the ground line 44-1 continues longer than the sum (tf+tr) in the current supply circuit 40-1, the microprocessor 26 generates the voltage off channel signal showing connection of the voltage input lines 46-1 during entire period corresponding to the last analyzed pixel brightness values.

On the other hand, when there is any case where the period during which the current output line 42-1 is connected to the ground line 44-1 continues longer than the sum (tf+tr) in the current supply circuit 40-1 (when any period during which the current output line 42-1 is connected to the ground line 44-1 is longer than the sum (tf+tr)), the microprocessor 26 generates the voltage off channel signal which shows not only disconnection of the voltage input lines 46-1 during the period longer than the sum (tf+tr) but also connection of the voltage input lines 46-1 during the other period.

In an example in FIG. 4, the pixel brightness value "0xxxxxxx" whose most significant bit (MSB) value is "0" continues during a period (1) more than the predetermined number of pixel clock cycles. In other words, the period (1) is longer than the sum (tf+tr). Though the pixel brightness value "0xxxxxxx" whose most significant bit value is "0" continues also during a period (2), the period (2) is shorter than the sum (tf+tr). The pixel brightness values in the other periods are "1xxxxxxx" whose most significant bit value is "1". Accordingly, in the example in FIG. 4, the microprocessor 26 generates the voltage off channel signal showing not only disconnection of the voltage input lines 46-1 (MSB channel) during the period (1) but also connection of the voltage input lines 46-1 during the other period.

Also regarding each of the current supply circuits 40-2 to 40-8, when there is no case where the period during which each of the current output lines 42-2 to 42-8 is connected to each of the ground lines 44-2 to 44-8 continues longer than the sum (tf+tr), the microprocessor 26 generates the voltage off channel signal showing connection of each of the voltage input lines 46-2 to 46-8 during entire period corresponding to the last analyzed pixel brightness values.

On the other hand, when there is any case where the period during which each of the current output lines 42-2 to 42-8 is connected to each of the ground lines 44-2 to 44-8 continues longer than the sum (tf+tr) in each of the current supply circuits 40-2 to 40-8 (when any period during which each of the current output lines 42-2 to 42-8 is connected to each of the ground lines 44-2 to 44-8 is longer than the sum (tf+tr)), the microprocessor 26 generates the voltage off channel signal which shows not only disconnection of each of the voltage input lines 46-2 to 46-8 during the period longer than the sum (tf+tr) but also connection of the voltage input lines 46-2 to 46-8 during the other period.

It is preferred that the above-described disconnection of each of the voltage input lines 46-1 to 46-8 is done simultaneously with connection between each of the current output lines 42-1 to 42-8 and each of the ground lines 44-1 to 44-8. The above-described connection of the voltage input lines 46-1 to 46-8 during the other period are preferably done before connection between each of the current output lines 42-1 to 42-8 and each of the current supply lines 43-1 to 43-8, because the current to be output from each of the current output lines 42-1 to 42-8 is desirable to rise to a constant value before each of the current output lines 42-1 to 42-8 is connected to each of the current supply lines 43-1 to 43-8. Accordingly, when each of the current output lines 42-1 to 42-8 is connected to each of the ground lines 44-1 to 44-8, the microprocessor 26 generates the voltage off channel signals so that each of the voltage input lines 46-1 to 46-8 is connected or disconnected as described above.

When all the current output lines 42-1 to 42-8 are connected to the respective ground lines 44-1 to 44-8 at the same time during a period longer than a predetermined number of pixel clock cycles (When the pixel brightness value "00000000" continues during the period longer than the predetermined number of pixel clock cycles), the microprocessor 26 generates the voltage off channel signal showing not only disconnection of the voltage input line 46-0 in the current supply circuit 40-0 for supplying the threshold current during the above-described period but also connection of the voltage input line 46-0 during the other period.

In the other case (When the pixel brightness value "00000000" does not continue during the period longer than the predetermined number of pixel clock cycles), the microprocessor 26 generates the voltage off channel signal showing connection of the voltage input line 46-0 in the current supply circuit 40-0 for supplying the threshold current during entire period corresponding to the last analyzed pixel brightness values.

The microprocessor 26 outputs the above-described generated voltage off channel signal to the voltage input switch control circuit 80 in synchronization with output of the output gradation signal.

The above-described output gradation signal is input to the switch control circuit 70. The above-described voltage off channel signal is input to the voltage input switch control circuit 80. The switch control circuit 70 controls the current path switches 45-1 to 45-8 in the current supply circuits 40-1 to 40-8 for supplying the radiance control currents based on the input output gradation signal. Additionally, the voltage input switch control circuit 80 controls the voltage input switches 61-1 to 61-8 in the current output prevention circuit 60 based on the input voltage off channel signal.

Accordingly, the laser driver circuit 30r executes the following processing based on the above-described output gradation signal and the input voltage off channel signal under the control of the switch control circuit 70 and the voltage input switch control circuit 80.

Specifically each of the current supply circuits 40-1 to 40-8 for supplying the radiance control currents switches connection of each of the current output lines 42-1 to 42-8 between each of the current supply lines 43-1 to 43-8 and each of the ground line 44-1 to 44-8 by the current path switches 45-1 to 45-8 with each pixel clock cycle based on the above-described output gradation signal under the control of the switch control circuit 70.

Thus, when both the voltage input line 46-0 in the current supply circuit 40-0 for supplying the threshold current and the voltage input lines 46-1 to 46-8 in the current supply circuits 40-1 to 40-8 for supplying the radiance control current are connected, a value of the current supplied to the laser diode 11r can be controlled with each pixel clock cycle so that the radiance of the laser beam to be emitted by the laser diode 11r can be controlled with each pixel clock cycle.

Under the control of the voltage input switch control circuit 80, the current output prevention circuit 60 selectively connects or disconnects both the voltage input line 46-0 in the current supply circuit 40-0 for supplying the threshold current and the voltage input lines 46-1 to 46-8 in the current supply circuits 40-1 to 40-8 for supplying the radiance control current by the voltage input switches 61-0 to 61-8 based on the above-described voltage off channel signal.

Specifically, when the period during which the current output line 42-1 is connected to the ground line 44-1 is longer than the sum (tf+tr) of the current fall time tf and the current rise time tr in the current supply circuit 40-1 for supplying the radiance control current, the current output prevention circuit 60 disconnects the voltage input line 46-1 by the voltage input switch 61-1 during the above-described period so that a voltage is not input to the voltage-to-current converter circuit 41-1. Thus, the current output prevention circuit 60 prevents the voltage-to-current converter circuit 41-1 from generating the radiance control current so as to prevent the radiance control current from being output via the current output line 42-1. In contrast, in the other time, the current output prevention circuit 60 connects the voltage input line 46-1 by the voltage input switch 61-1.

Thus, when the voltage-to-current converter circuit 41-1 does not supply the radiance control current to the laser diode 11r in the current supply circuit 40-1 for supplying the radiance control current, the possibility can be reduced that an unnecessary current which does not contribute to the light emission of the laser diode 11r is generated and flows to the ground.

Similarly, when the period during which each of the current output lines 42-2 to 42-8 is connected to each of the ground lines 44-2 to 44-8 is longer than the sum (tf+tr) of the current fall time tf and the current rise time tr in each of the current supply circuits 40-2 to 40-8 for supplying the radiance control current, the current output prevention circuit 60 disconnects each of the voltage input lines 46-2 to 46-8 by each of the voltage input switches 61-2 to 61-8 during the above-described period so that a voltage is not input to each of the voltage-to-current converter circuits 41-2 to 41-8. Thus, the current output prevention circuit 60 prevents each of the voltage-to-current converter circuits 41-2 to 41-8 from generating the radiance control current so as to prevent the radiance control current from being output via each of the current output lines 42-2 to 42-8. In contrast, in the other time, the current output prevention circuit 60 connects each of the voltage input lines 46-2 to 46-8 by each of the voltage input switches 61-2 to 61-8.

Thus, when each of the voltage-to-current converter circuits 41-2 to 41-8 does not supply the radiance control current to the laser diode 11r in each of the current supply circuits 40-2 to 40-8 for supplying the radiance control current, the possibility can be reduced that an unnecessary current which does not contribute to the light emission of the laser diode 11r is generated and flows to the ground.

The current output prevention circuit 60 disconnects each of the voltage input lines 46-1 to 46-8 simultaneously with connection between each of the current output lines 42-1 to 42-8 and each of the ground lines 44-1 to 44-8. Additionally, the current output prevention circuit 60 connects the voltage input lines 46-1 to 46-8 before connection between each of the current output lines 42-1 to 42-8 and each of the current supply lines 43-1 to 43-8 so that the current to be output from each of the current output lines 42-1 to 42-8 rises to a constant value (the steady-state current value) before each of the current output lines 42-1 to 42-8 is connected to each of the current supply lines 43-1 to 43-8.

Thus, when each of the current output lines 42-1 to 42-8 is connected to each of the current supply lines 43-1 to 43-8 again after being connected to each of the ground lines 44-1 to 44-8, the current which is output from each of the current output lines 42-1 to 42-8 so as to be supplied to the laser diode 11r is not the changing (increasing) current during the current rise time tr, but the stable current with a constant value after the current rise time tr. Accordingly, when each of the current output lines 42-1 to 42-8 is connected to each of the current supply lines 43-1 to 43-8 again after being connected to each of the ground lines 44-1 to 44-8, the radiance of the laser beam to be emitted by the laser diode 11r can be made constant.

When all the current output lines 42-1 to 42-8 are connected to the respective ground lines 44-1 to 44-8 at the same time during a period longer than a predetermined time period, the current output prevention circuit 60 disconnects the voltage input line 46-0 in the current supply circuit 40-0 for supplying the threshold current using the voltage input switch 61-0 during the above-described period so that the threshold voltage is not input to the voltage-to-current converter circuit 41-0. Thus, the current output prevention circuit 60 prevents the voltage-to-current converter circuit 41-0 from generating the threshold current and prevents the threshold current from being output from the current output supply line 42-0. In contrast, in the other time, the current output prevention circuit 60 connects the voltage input line 46-0 in the current supply circuit 40-0 for supplying the threshold current by the voltage input switch 61-0.

Thus, when none of the current supply circuits 40-1 to 40-8 for supplying the radiance control currents supplies the radiance control current to the laser diode 11r (when the laser diode 11r is not emitted), an unnecessary current cannot be generated and cannot flow to the ground.

According to the laser driver circuit 30r having the above-described configuration, when each of the voltage-to-current converter circuits 41-1 to 41-8 does not supply the radiance control current to the laser diode 11r in each of the current supply circuits 40-1 to 40-8 for supplying the radiance control current, the possibility can be reduced that an unnecessary current which does not contribute to the light emission of the laser diode 11r is generated by each of the voltage-to-current converter circuits 41-1 to 41-8 and flows to the ground. Thus, compared to a conventional laser driver circuit, the laser driver circuit 30r can reduce power consumption, thereby can drive the laser diode 11r with lower power consumption.

Additionally, according to the laser driver circuit 30r, by a simple structure where each of the voltage input lines 46-1 to 46-8 is disconnected by each of the voltage input switches 61-1 to 61-8, the possibility can be reduced that an unnecessary current which does not contribute to the light emission of the laser diode 11r is generated and flows to the ground. Furthermore, because the laser driver circuit 30r employs the structure where each of the voltage input lines 46-1 to 46-8 is connected or disconnected by each of the voltage input switches 61-1 to 61-8, a current fall time and a current rise time of a current to be output from each of the current output lines 42-1 to 42-8 can be shortened, compared to the case where voltage-to-current convert function of each of the voltage-to-current converter circuits 41-1 to 41-8 is halted or restarted. Thus, not only rapid control of the radiance of the laser beam to be emitted from the laser diode 11r but also reducing power consumption can be realized.

The present invention has been described above using a presently preferred embodiment, but those skilled in the art will appreciate that various modifications are possible. For example, in place of the voltage input switches 61-0 to 61-8 for switching between connection and disconnection of the voltage input lines 46-1 to 46-8, the current output prevention circuit 60 may have current output switches for switching between connection and disconnection of the current output lines 42-1 to 42-8. In this structure, the current output lines 42-1 to 42-8 are disconnected by the current output switches so that the current supply lines 43-1 to 43-8 are opened. Thus, the current output switches can prevent the voltage-to-current converter circuits 41-1 to 41-8 from generating the currents, and prevents the currents from being output. In this case, when the period during which each of the current output lines 42-1 to 42-8 is connected to each of the ground lines 44-1 to 44-8 is longer than the sum of a current fall time and a current rise time in each of the current supply circuits 40-1 to 40-8, the current output lines 42-1 to 42-8 are disconnected by the current output switches. In this case, the current fall time is a pulse fall time of a current to be output from each of the current output lines 42-1 to 42-8 when each of the current output lines 42-1 to 42-8 is disconnected by each of the current output switches. On the other hand, the current rise time is a pulse rise time of a current to be output from each of the current output lines 42-1 to 42-8 when each of the current output lines 42-1 to 42-8 is connected by each of the current output switches.

In the case where the sum of a current fall time and a current rise time in each of the current supply circuits 40-1 to 40-8 for supplying the radiance control currents is shorter than one pixel clock cycle, it is not necessary to determine whether or not the period during which each of the current output lines 42-1 to 42-8 is connected to each of the ground lines 44-1 to 44-8 can be longer than the sum of a current fall time and a current rise time. In this case, when each of the current output lines 42-1 to 42-8 is connected to each of the ground lines 44-1 to 44-8, each of the voltage input lines 46-0 to 46-8 (or each of the current output lines 42-1 to 42-8) is always desirable to be disconnected.

In place of the voltage input switches 61-1 to 61-8 for switching between connection and disconnection of the voltage input lines 46-1 to 46-8, the current output prevention circuit 60 may have a voltage control circuit for controlling a value of a voltage to be output by each of the radiance voltage output circuits 47-1 to 47-8. In this configuration, the voltage control circuit makes a value of the output voltage from each of the radiance voltage output circuits 47-1 to 47-8 be zero so that a voltage is not input to each of the voltage-to-current converter circuits 41-0 to 41-8. Thus, the current output prevention circuit 60 prevents each of the voltage-to-current converter circuits 41-1 to 41-8 from generating the radiance control current so as to prevent the radiance control current from being output via each of the current output lines 42-1 to 42-8.

Furthermore, the laser driver circuit according to the present invention can be applied to not only a laser display but also every electrical equipment which emits a laser beam using a laser diode.

This application is based on Japanese patent application 2008-229897 filed Sep. 8, 2008, the contents of which are hereby incorporated by reference.

What is claimed is:

1. A laser driver circuit which supplies a laser diode with a current so as to drive the laser diode, the laser driver circuit comprising a current supply circuit for supplying the laser diode with the current,
wherein the current supply circuit comprises:
a voltage-to-current converter circuit for converting an input voltage to the current so as to generate the current;
a current output line which is connected to the voltage-to-current converter circuit, and which outputs the current generated by the voltage-to-current converter circuit;
a current supply line which is connected to the laser diode, and which supplies the laser diode with the current generated by the voltage-to-current converter circuit;
a ground line connected to the ground; and
a current path switch for selectively connecting either the current supply line or the ground line to the current output line,
wherein the current which is output from the voltage-to-current converter circuit, and which is running through the current output line, the current path switch and the current supply line is supplied to the laser diode so as to drive the laser diode,
wherein the laser driver circuit further comprises a current output prevention circuit for preventing the voltage-to-current converter circuit from generating the current and preventing the current from being output from the current output line, when the current output line and the ground line are connected by the current path switch,
wherein the current supply circuit further comprises a voltage input line which is connected to the voltage-to-current converter circuit, and which inputs a voltage to the voltage-to-current converter circuit,
wherein the current output prevention circuit further comprises a voltage input switch for switching between connection and disconnection of the voltage input line,
wherein by disconnecting the voltage input line using the voltage input switch so that the voltage is not input to the voltage-to-current converter circuit, the current output prevention circuit prevents the voltage-to-current converter circuit from generating the current,
wherein when the period during which the current output line is connected to the ground line by the current path switch is longer than the sum of a current fall time and a current rise time, the current output prevention circuit disconnects the voltage input line using the voltage input switch so that the voltage is not input to the voltage-to-current converter circuit,
wherein the current fall time is a period during which the current to be output from the current output line decays to zero, when the voltage input line has been disconnected by the voltage input switch, and
wherein the current rise time is a period during which the current to be output from the current output line rises from zero level to the steady-state current level, when the voltage input line has been connected by the voltage input switch.

2. A laser driver circuit which supplies a laser diode with a current so as to drive the laser diode, the laser driver circuit comprising a current supply circuit for supplying the laser diode with the current,
wherein the current supply circuit comprises:
a voltage-to-current converter circuit for converting an input voltage to the current so as to generate the current;
a current output line which is connected to the voltage-to-current converter circuit, and which outputs the current generated by the voltage-to-current converter circuit;
a current supply line which is connected to the laser diode, and which supplies the laser diode with the current generated by the voltage-to-current converter circuit;
a ground line connected to the ground; and
a current path switch for selectively connecting either the current supply line or the ground line to the current output line,
wherein the current which is output from the voltage-to-current converter circuit, and which is running through the current output line, the current path switch and the current supply line is supplied to the laser diode so as to drive the laser diode,
wherein the laser driver circuit further comprises a current output prevention circuit for preventing the voltage-to-current converter circuit from generating the current and preventing the current from being output from the current output line, when the current output line and the ground line are connected by the current path switch,
wherein the number of the current supply circuits is plural, wherein the currents running through the current supply lines of the current supply circuits are converged and supplied to the laser diode so as to drive the laser diode, and wherein when the current output line and the ground line are connected by the current path switch in any of the current supply circuits, the current output prevention circuit prevents the voltage-to-current converter circuit from generating the current in the current supply circuit in which the current output line and the ground line are connected.

3. A laser display which scans a laser beam across a screen so as to display an image on the screen, the laser display comprising:

a laser diode for emitting the laser beam;

a laser driver circuit which supplies the laser diode with a current so as to drive the laser diode; and a scanning means for scanning the laser beam emitted by the laser diode across the screen, wherein the laser display displays the image on the screen not only by controlling scanning of the scanning means to control a laser beam irradiated position on the screen, but also by controlling driving of the laser diode using the laser driver circuit so as to control the radiance of the laser beam to be irradiated on the screen, wherein the laser driver circuit comprises a current supply circuit for supplying the laser diode with the current, wherein the current supply circuit comprises:

a voltage-to-current converter circuit for converting an input voltage to the current so as to generate the current;

a current output line which is connected to the voltage-to-current converter circuit, and which outputs the current generated by the voltage-to-current converter circuit;

a current supply line which is connected to the laser diode, and which supplies the laser diode with the current generated by the voltage-to-current converter circuit;

a ground line connected to the ground; and a current path switch for selectively connecting either the current supply line or the ground line to the current output line, wherein the current which is output from the voltage-to-current converter circuit, and which is running through the current output line, the current path switch and the current supply line is supplied to the laser diode so as to drive the laser diode, wherein the laser driver circuit further comprises a current output prevention circuit for preventing the voltage-to-current converter circuit from generating the current and preventing the current from being output from the current output line, when the current output line and the ground line are connected by the current path switch, wherein the current supply circuit further comprises a voltage input line which is connected to the voltage-to-current converter circuit, and which inputs a voltage to the voltage-to-current converter circuit, wherein the current output prevention circuit further comprises a voltage input switch for switching between connection and disconnection of the voltage input line, wherein by disconnecting the voltage input line using the voltage input switch so that the voltage is not input to the voltage-to-current converter circuit, the current output prevention circuit prevents the voltage-to-current converter circuit from generating the current, wherein when the period during which the current output line is connected to the ground line by the current path switch is longer than the sum of a current fall time and a current rise time, the current output prevention circuit disconnects the voltage input line using the voltage input switch so that the voltage is not input to the voltage-to-current converter circuit, wherein the current fall time is a period during which the current to be output from the current output line decays to zero, when the voltage input line has been disconnected by the voltage input switch, and wherein the current rise time is a period during which the current to be output from the current output line rises from zero level to the steady-state current level, when the voltage input line has been connected by the voltage input switch.

4. A laser display which scans a laser beam across a screen so as to display an image on the screen, the laser display comprising:

a laser diode for emitting the laser beam;

a laser driver circuit which supplies the laser diode with a current so as to drive the laser diode; and a scanning means for scanning the laser beam emitted by the laser diode across the screen, wherein the laser display displays the image on the screen not only by controlling scanning of the scanning means to control a laser beam irradiated position on the screen, but also by controlling driving of the laser diode using the laser driver circuit so as to control the radiance of the laser beam to be irradiated on the screen, wherein the laser driver circuit comprises a current supply circuit for supplying the laser diode with the current, wherein the current supply circuit comprises:

a voltage-to-current converter circuit for converting an input voltage to the current so as to generate the current;

a current output line which is connected to the voltage-to-current converter circuit, and which outputs the current generated by the voltage-to-current converter circuit;

a current supply line which is connected to the laser diode, and which supplies the laser diode with the current generated by the voltage-to-current converter circuit;

a ground line connected to the ground; and a current path switch for selectively connecting either the current supply line or the ground line to the current output line, wherein the current which is output from the voltage-to-current converter circuit, and which is running through the current output line, the current path switch and the current supply line is supplied to the laser diode so as to drive the laser diode, wherein the laser driver circuit further comprises a current output prevention circuit for preventing the voltage-to-current converter circuit from generating the current and preventing the current from being output from the current output line, when the current output line and the ground line are connected by the current path switch, wherein the number of the current supply circuits is plural, wherein the currents running through the current supply lines of the current supply circuits are converged and supplied to the laser diode so as to drive the laser diode, and wherein when the current output line and the ground line are connected by the current path switch in any of the current supply circuits, the current output prevention circuit prevents the voltage-to-current converter circuit from generating the current in the current supply circuit in which the current output line and the ground line are connected.

5. The laser driver circuit according to claim 1, wherein the connection of the voltage input line is done before the connection between the current output line and the current supply line so that the current to be output from the current output line rises to a constant value before the connection between the current output line and the current supply line.

6. The laser display according to claim 3, wherein the connection of the voltage input line is done before the connection between the current output line and the current supply line so that the current to be output from the current output line rises to a constant value before the connection between the current output line and the current supply line.

\* \* \* \* \*